United States Patent
Nitta et al.

(10) Patent No.: US 6,753,687 B2
(45) Date of Patent: Jun. 22, 2004

(54) CAPACITIVE LOAD DRIVING UNIT AND METHOD AND APPARATUS FOR INSPECTING THE SAME

(75) Inventors: Noburo Nitta, Shizuoka-ken (JP); Jun Takamura, Mishima (JP); Shunichi Ono, Shizuoka-ken (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 6 days.

(21) Appl. No.: 10/217,090

(22) Filed: Aug. 12, 2002

(65) Prior Publication Data

US 2002/0190730 A1 Dec. 19, 2002

Related U.S. Application Data

(62) Division of application No. 09/372,820, filed on Aug. 11, 1999, now Pat. No. 6,462,433.

(30) Foreign Application Priority Data

Aug. 13, 1998 (JP) ............................................. 10-228947

(51) Int. Cl.$^7$ ................................................ G01R 31/12
(52) U.S. Cl. ........................................ 324/548; 324/678
(58) Field of Search .......................... 307/48; 324/76.11, 324/76.44, 76.61, 548, 658, 676, 678; 347/15

(56) References Cited

U.S. PATENT DOCUMENTS

| 4,630,270 A | * | 12/1986 | Petit et al. ..................... 714/45 |
| 5,940,097 A | * | 8/1999 | Imai ............................. 347/49 |
| 6,068,360 A | * | 5/2000 | Hiwada ........................ 347/14 |
| 6,281,685 B1 | * | 8/2001 | Tuttle .......................... 324/529 |
| 6,454,377 B1 | * | 9/2002 | Ishizaki ....................... 347/15 |

FOREIGN PATENT DOCUMENTS

| JP | 09-48117 A | 2/1997 |
| JP | 10-86358 A | 4/1998 |

* cited by examiner

*Primary Examiner*—N. Le
*Assistant Examiner*—Walter Benson
(74) *Attorney, Agent, or Firm*—Frishauf, Holtz, Goodman & Chick, P.C.

(57) ABSTRACT

A capacitive load driving unit includes a plurality of capacitive loads, a drive circuit for charging and discharging the capacitive loads, a pair of power lines for supplying a drive voltage from an external power source to the drive circuit, and a current reserve circuit for reserving a current required by the drive circuit for charging the capacitive loads. The current reserve circuit includes a capacitor that is charged by the drive voltage from the power lines, and a coupler section for coupling the capacitor between the power lines except for when a defect inspection is conducted.

8 Claims, 11 Drawing Sheets

CAPACITIVE LOAD DRIVING UNIT AND METHOD AND APPARATUS FOR INSPECTING THE SAME

This is a Division of application Ser. No. 09/372,820 filed Aug. 11, 1999 now U.S. Pat. No. 6,462,433.

BACKGROUND OF THE INVENTION

The present invention relates to a capacitive load driving unit integrally incorporating a capacitive load such as a print head for an ink-jet printer and a drive circuit for the capacitive load, and a method and apparatus for inspecting the unit.

The print head of a typical ink-jet printer has a plurality of ink chambers arranged in a line and partitioned by a plurality of electrostrictive members. Each of the ink chambers jets or ejects drops of ink from an ink-jet nozzle thereof upon a change in pressure caused when a corresponding electrostrictive member deforms according to a voltage applied to a pair of electrodes formed on both sides of the electrostrictive member. The pair of electrodes and the electrostrictive member constitute a capacitive load.

Figure 21:
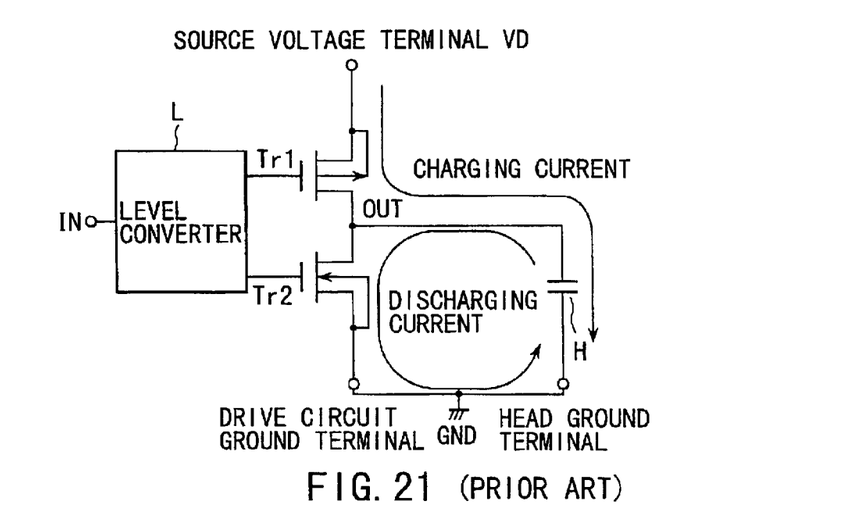
FIG. 21 is an equivalent circuit diagram of a drive circuit for charging and discharging a capacitive load of an ink-jet print head.

FIG. 21 shows an example of a drive circuit for driving such a capacitive load. This drive circuit includes a pair of transistors Tr1 and Tr2 and a level converter L. A capacitive load H is connected between a ground terminal GND and output terminal OUT of the 25 drive circuit. The transistor Tr1 is connected between a source voltage terminal VD and the output terminal OUT. The transistor Tr2 is connected between the output terminal OUT and the ground terminal GND. The level converter L generates voltage signals for alternately turning on these transistors Tr1 and Tr2. The voltage across the capacitive load H is set to a level equal to that of the source voltage terminal VD by a charge current flowing from the source voltage terminal VD to the capacitive load H through the transistor Tr1 when the transistor Tr1 is turned on. In addition, the voltage across the capacitive load H is set to a level equal to that of the ground terminal GND by a discharge current flowing from the capacitive load H to the ground terminal GND through the transistor Tr2 when the transistor Tr2 is turned on.

When the above print head and drive circuit are to be manufactured as a single head unit, the connection state between the head and drive circuit is inspected or checked to determine whether the head unit is nondefective or defective. However, the print head and the drive circuit are interconnected by a large number of wiring lines such as about 100 to 3000 wiring lines which are very thin and arranged at a small pitch of about 50 to 200 μm. For these reasons, it is nearly impossible that a probe for picking up a current or voltage is sequentially set to be in contact with the wiring lines when the print head is driven.

Figure 22:
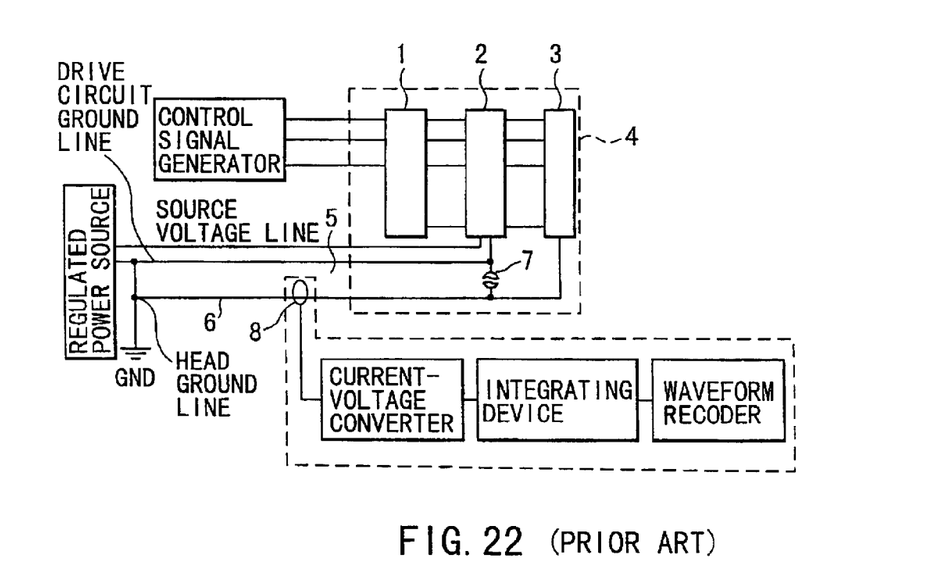
FIG. 22 is a block diagram for explaining a conventional waveform-recording scheme.

Under the circumstances, Jpn. Pat. Appln. KOKAI Publication No. 10-86358 discloses a head unit 4 which is, as shown in FIG. 22, comprised of a unit interface 1, drive circuit 2, and print head 3, and a solder point 7. In the head unit 4, the solder point 7 is formed as a melt coupler between a drive circuit ground line 5 and a head ground line 6. A waveform of a current flowing from the print head 3 to the head ground line 6 is detected with a current probe 8 while the solder point 7 is set in a disconnected state, and this current waveform is converted into a voltage waveform by a current-voltage converter. The voltage waveform is integrated by an integrating device and supplied to a waveform recorder. The waveform recording unit records this waveform. The recorded waveform is compared with a normal waveform to determine whether the print head unit 4 is nondefective or defective. After the inspection, the solder point 7 is melted for short-circuiting so as to prevent currents for charging and discharging the print head 3 from flowing outside the head unit 4.

A power source voltage is applied from an external power source to a head unit via a relatively long cable. In a case where the print head is driven at a high speed, the inductance component of the cable greatly influences the current-supply ability of the external power source, so that current supply cannot follow the charging cycle of the capacitive load. To cope with the problem, the head unit 4 may have a bypass capacitor which is connected between the power lines 5 and 6 and located near the drive circuit 2 to be subjected to almost no influence of the inductance component of the cable. The capacitor is charged by the drive voltage applied from the external power source to reserve a current required by the drive circuit 2 for charging the capacitive load.

When the capacitor is incorporated in the head unit 4 of the reference and the waveform of a current flowing from the print head 3 to the head ground line 6 is detected as described above, the current waveform cannot be correctly detected owing to the influence of the capacitor. As a result, whether the head unit is nondefective or defective cannot be accurately determined.

BRIEF SUMMARY OF THE INVENTION

It is an object of the present invention to provide a capacitive load driving unit, an inspection method and an inspection apparatus for the unit, which permit a defect inspection to be performed without being influenced by a capacitor for reserving a current for charging a capacitive load.

According to the present invention, there is provided a capacitive load driving unit which comprises a plurality of capacitive loads, a drive circuit for charging and discharging the capacitive loads, a pair of power lines for supplying a drive voltage from an external power source to the drive circuit, and a current reserve circuit for reserving a current required by the drive circuit for charging the capacitive loads, wherein the current reserve circuit includes a capacitor that is charged by the drive voltage from the power lines, and a coupler section for coupling the capacitor between the power lines except for when a defect inspection is conducted.

Further, according to the present invention, there is provided an inspection method for a capacitive load driving unit which comprises a plurality of capacitive loads, a drive circuit for charging and discharging the capacitive loads, a pair of power lines for supplying a drive voltage from an external power source to the drive circuit, and a current reserve circuit for reserving a current required by the drive circuit for charging the capacitive loads, wherein the current reserve circuit includes a capacitor that is charged by the drive voltage from the power lines, and a coupler section for coupling the capacitor between the power lines except for when a defect inspection is conducted, the method comprising the steps of controlling the drive circuit to sequentially drive the plurality of capacitive loads in a state where the capacitor is disconnected from the power lines; and detecting an electric change that occurs on the power line upon driving each of the capacitive loads to determine whether or not a defect is present.

Moreover, according to the present invention, there is provided an inspection apparatus for a capacitive load driving unit which comprises a plurality of capacitive loads, a drive circuit for charging and discharging the capacitive loads, a pair of power lines for supplying a drive voltage from an external power source to the drive circuit, and a current reserve circuit for reserving a current required by the drive circuit for charging the capacitive loads, wherein the current reserve circuit includes a capacitor that is charged by the drive voltage from the power lines, and a coupler section for coupling the capacitor between the power lines except for when a defect inspection is conducted, the apparatus comprising a control circuit for controlling the drive circuit to sequentially drive the plurality of capacitive loads in a state where the capacitor is disconnected from the power lines, and a detecting circuit for detecting an electric change that occurs on the power line upon driving each of the capacitive loads to determine whether or not a defect is present.

In the capacitive load driving unit, the inspection method, and the inspection apparatus, the coupler section causes the capacitor for reserving a charging current for the capacitive loads to be disconnected from the power lines in a defect inspection. Therefore, the defect inspection can be performed without being influenced by the capacitor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A head unit for an ink-jet printer according to an embodiment of the present invention will be described with reference to the views of the accompanying drawing.

Figure 1:
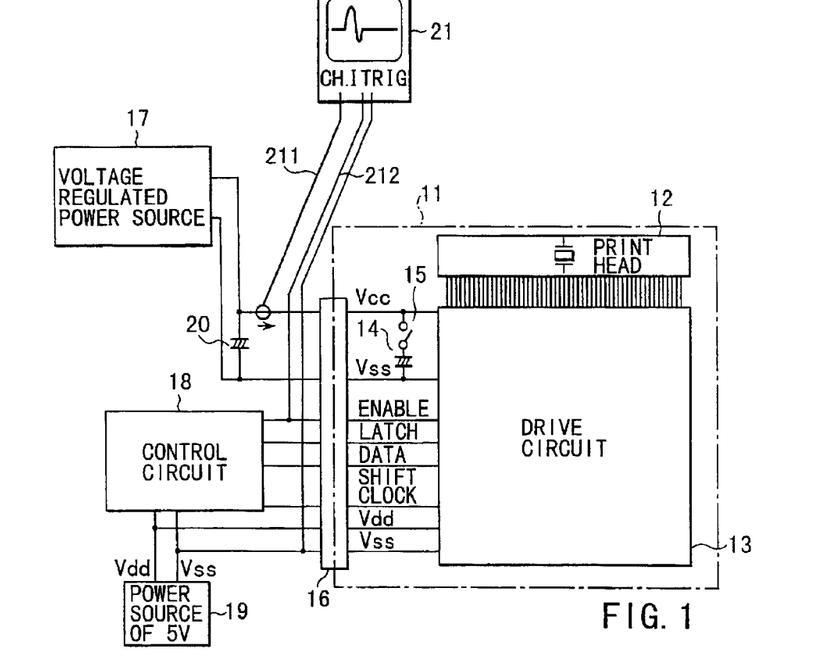
FIG. 1 is a block diagram showing a head unit for an ink-jet printer according to an embodiment of the present invention.

FIG. 1 shows the head unit 11 for the ink-jet printer. This head unit 11 includes an ink-jet print head 12 and a drive circuit 13 which are formed in one unit. The print head 12 has a plurality of ink chambers arranged in a line and partitioned by a plurality of electrostrictive members. Each of the ink chambers jets or ejects drops of ink from an ink-jet nozzle thereof upon a change in pressure caused by deformation of a corresponding electrostrictive member. Each of the electrostrictive members is formed between a pair of electrodes to constitute a capacitive load that deforms according to a voltage applied to the pair of electrodes. The drive circuit 13 is arranged to charge or discharge the capacitive loads by a drive voltage supplied thereto via power lines Vcc and Vss. The head unit 11 further includes a current reserve circuit for reserving a current required by the drive circuit 13 to charge the capacitive loads. The current reserve circuit has a capacitor 14 which is charged by the drive voltage supplied via the power lines Vcc and Vss and a coupler section 15 for coupling the capacitor 14 between the power lines Vcc and Vss except for a defect inspection. The capacitor 14 has a function of instantaneously supplying a charge current for the capacitive loads to the drive circuit 13 and also bypassing a power source noise. To attain this function, the capacitor 14 has a capacitance which is 200 times the sum of the capacitances of all the capacitive loads. In a case where the print head 12 is comprised of 100 capacitive loads each having a capacitance of 500 pF, the capacitor 14 is determined to have a capacitance of 10 $\mu$F.

The print head 12 and the drive circuit 13 are interconnected by a large number of wiring lines such as about 100 to 300 wiring lines formed of TABs, bonding wires, or the like. These wiring lines are very thin and arranged at a small pitch of about 50 to 200 $\mu$m.

The head unit 11 further includes a connector 16 which is used for detachably connecting the drive circuit 13 to the external inspection apparatus. This inspection apparatus includes a regulated power source for supplying a power source voltage as the drive voltage to the drive circuit 13 via the power lines Vcc and Vss, a control circuit 18 for supplying an enable signal, a latch signal, data signal, and a shift clock signal to the drive circuit via signal lines, a 5-V power source 19 for supplying a power source voltage of 5V via power lines Vdd and Vss to the drive circuit 13, and a power line capacitor 20 connected between the power lines Vcc and Vss and having a capacitance substantially equal to that of the capacitor 14. The capacitor 14 is located at a position closer to the drive circuit 13 than the connector 16.

Figure 2:
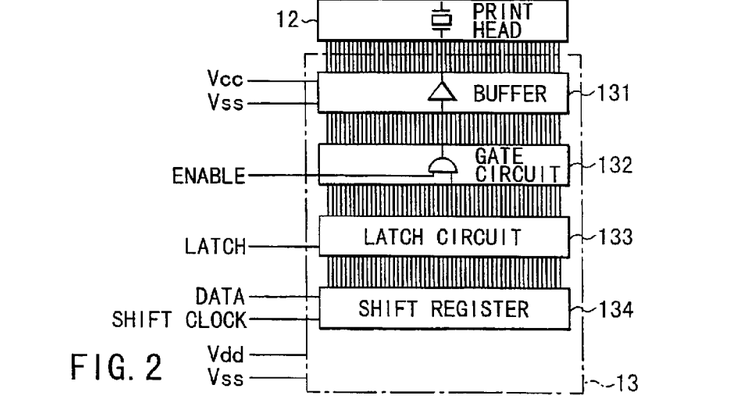
FIG. 2 is a block diagram showing the arrangement of a drive circuit shown in FIG. 1.

FIG. 2 shows the arrangement of the drive circuit 13. The drive circuit 13 is comprised of a buffer 131, gate circuit 132, latch circuit 133, and shift register 134. Data from the control circuit 18 are stored in the shift register 134 while sequentially shifted in synchronism with a shift clock. When a series of data for driving the ink-jet print head 12 is stored in the shift register 134, a latch signal from the control circuit 18 is input to the latch circuit 133 to latch the data items from the shift register 134 in the latch circuit 133. When an enable signal from the control circuit 18 is activated afterward, the gate circuit 132 operates to supply the data items latched by the latch circuit 133 to the buffer 131. As a consequence, the drive voltage is applied to the capacitive loads for the ink chambers of the print head 13 on the basis of the data items.

A current probe 211 of an oscilloscope 21 for recording a current waveform is arranged between the capacitor 20 and the connector 16 on the power line Vcc which are connected to the voltage regulated power source 17 and the connector 16. In addition, a voltage probe 212 of the oscilloscope 21 is connected between the enable signal line and the power line Vss. With this arrangement, the oscilloscope 21 detects the waveform of a current flowing through the power line Vcc in response to an enable signal serving as a trigger, and displays the current waveform on the display screen.

Since a large pulse current flows into the head unit 11 in driving operation, the capacitor 14 must be connected between portions of the power lines Vcc and Vss which are located near the drive circuit 13. Without this capacitor 14, when a plurality of capacitive loads simultaneously operate, a voltage drop occurs due to the impedance of the power lines Vcc and Vss, resulting in an operation error. In addition, this abrupt voltage drop causes unnecessary high-frequency electric waves. For this reason, the coupler section 15 is set in a closed state at a time when the head unit 11 is incorporated in the printer and actually used.

At a time of inspecting a defect in the head unit 11, the waveform of a current flowing through the power line Vcc must be detected with the current probe 211 of the oscilloscope 21. If the capacitor 14 connected between the power lines Vcc and Vss is present, most of the current is absorbed by the capacitor 14. As a result, no current waveform can be detected. Therefore, the coupler section 15 is set in an open state to disconnect the capacitor 14 at the time of defect inspection. No problem is posed due to disconnection of the capacitor 14, since the inspection is performed by sequentially driving the capacitive loads and a large amount of current is not required contrary to the case where the capacitive loads are simultaneously driven. In addition, the capacitor 20 of the inspection apparatus performs the same function as that of the capacitor 14 to a certain degree in place of the capacitor 14.

Figure 3:
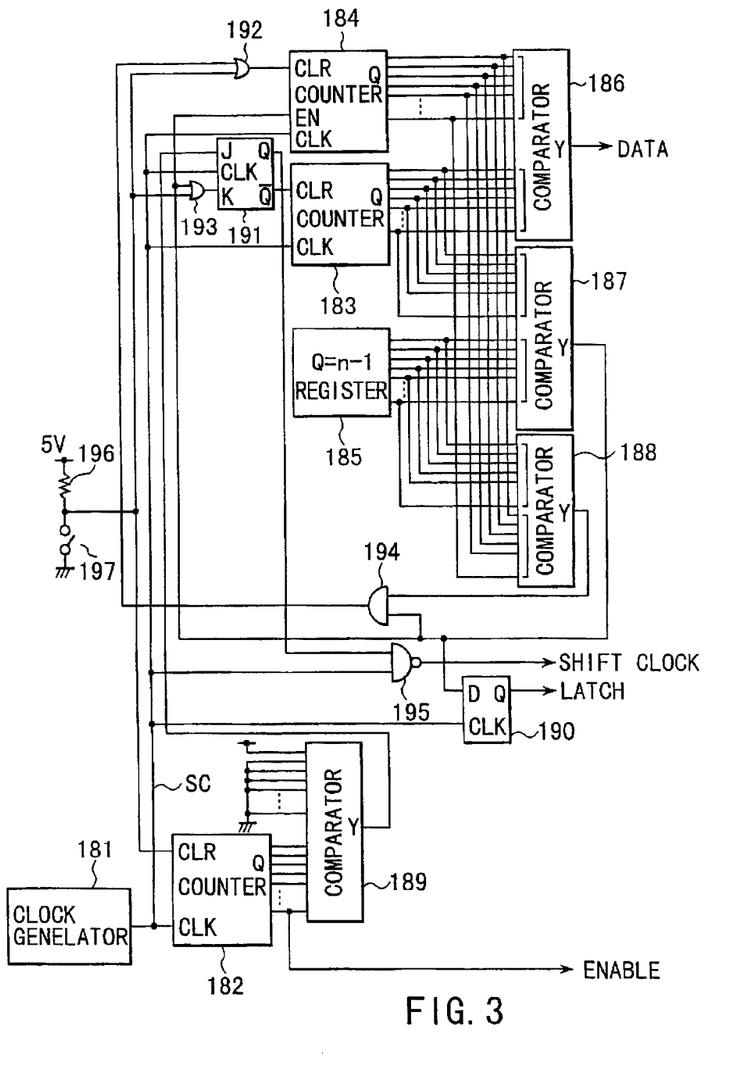
FIG. 3 is a block diagram showing the arrangement of a control circuit for controlling the drive circuit shown in FIG. 1.

As shown in FIG. 3, the control circuit 18 includes a clock generator 181, first, second, and third counters 182, 183, and 184, register 185, first, second, third, and fourth comparators 186, 187, 188, and 189, first and second flip-flops 190 and 191, 2-input OR gates 192 and 193, 2-input AND gate 194, 2-input NAND gate 195, and a selector circuit of a resistor 196 and switch 197 connected in series between a 5-V and ground terminals Vdd and Vss of the power source 19. A clock from the clock generator 181 is supplied as a system clock SC to the counters 182, 183, and 184, the flip-flops 190 and 191, and 2-input NAND gate 195.

Figure 4:
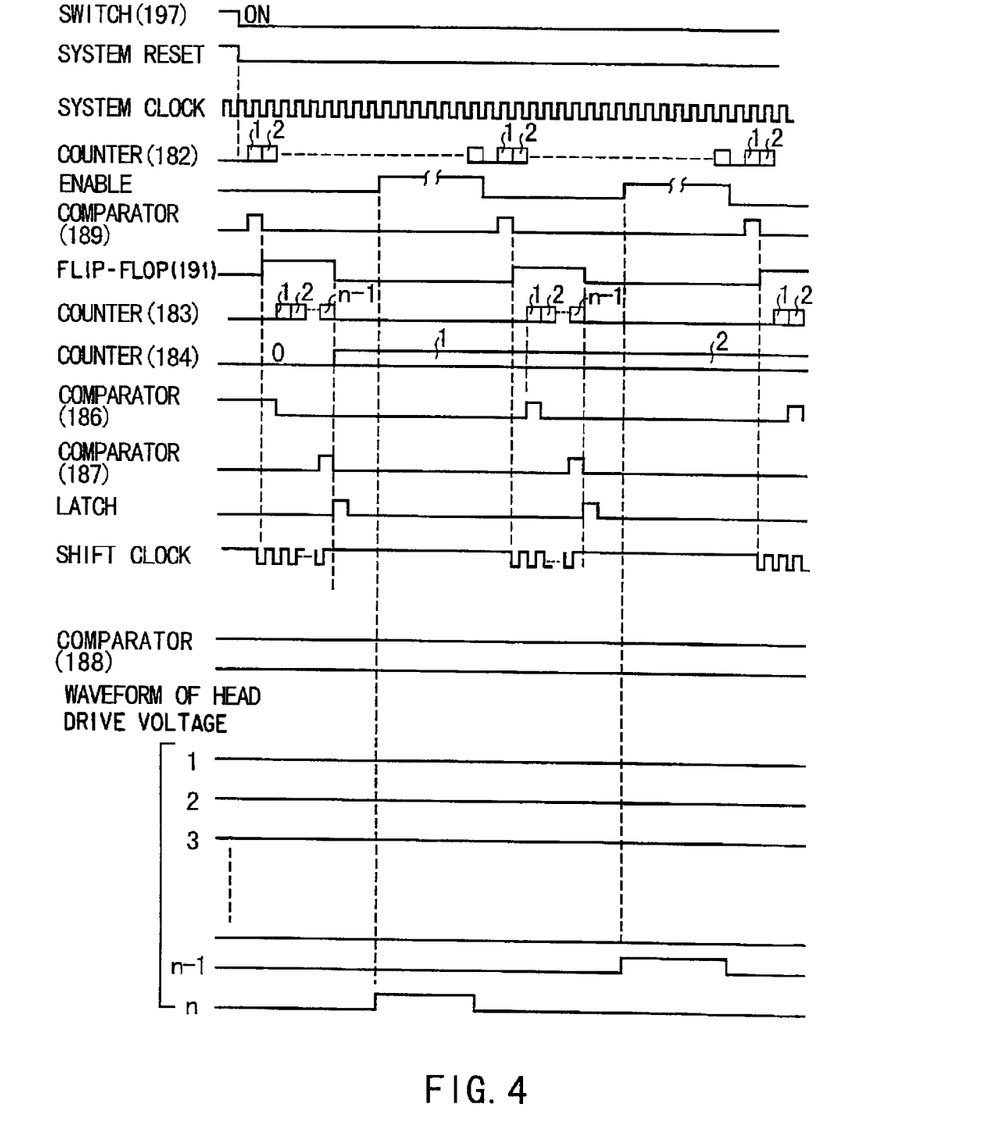
FIGS. 4 and 5 are timing charts for explaining the operation of the control circuit shown in FIG. 3.
Figure 5:
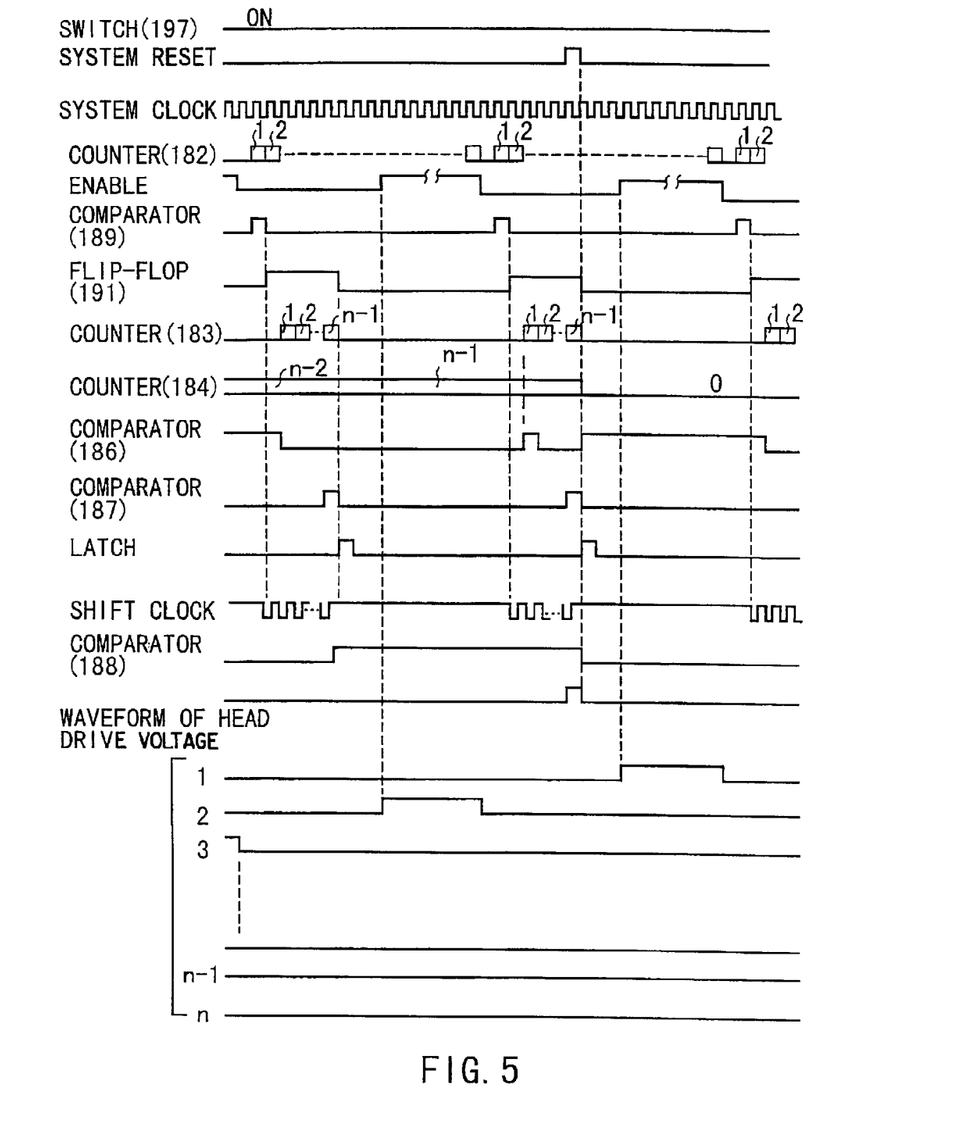

FIGS. 4 and 5 show the operation of the control circuit 18. The control circuit 18 is initialized when the switch 187 is in an OFF state. When the switch 197 is turned on, the control circuit 18 starts operating. The first counter 182 determines the driving cycle of each capacitive load of the ink-jet print head 12. Data is shifted in the first half period of the operation of the first counter 182. In the second half period, an enable signal is set at high level to drive the capacitive loads selected by the data items.

The fourth comparator 189 sets the second flip-flop 191 at the first count of the first counter 182. When the second flip-flop 191 is set, the second counter 183 starts counting. At the same time, a shift clock is output through the NAND gate 195.

A value "n−1" is set in the register 185 in advance. At first, the second comparator 187 detects no coincidence, and the third counter 184 does not operate. Consequently, the output from the third counter 184 is kept at "0". Since this value coincides with the initial value of the second counter 183, the data output from the first comparator 186 is "1". The output from this counter 183 becomes "1" at the first count of the second counter 183. However, since the output from the third counter 184 remains "0", the first comparator 186 detects no coincidence, and the output data becomes "0".

Subsequently, when the second counter 183 continues counting operation in accordance with the system clock from the clock generator 181, and the counter value of the second counter 183 reaches "n−1", the second comparator 187 detects a coincidence, and the third counter 184 is incremented by one. At the same time, the first flip-flop 190 is set to output a latch signal. In addition, the second flip-flop 191 is reset to clear the second counter 183. In addition, the NAND gate 195 is disabled to stop outputting the shift clock. Since the output from the third counter 184 is "1", the third comparator 188 detects no coincidence, and the AND gate 194 is disabled.

When the most significant bit of the Q output from the first counter 182 become "1", and the second half counting operation starts, an enable signal is output. The drive circuit 13 generates a head drive voltage waveform for driving the nth capacitive load and supplies it to the ink-jet print head 12.

When the first counter 182 completes one cycle of counting operation, the circuit state is restored to the initial state. At this time, since only the third counter 184 is kept incremented by one and not cleared, the first comparator 186 detects a coincidence at the second clock of the shift clock signal in the next cycle. As a consequence, the data "1" is output from the comparator 186. When, therefore, the first counter 182 starts the second half counting operation in the next cycle, and an enable signal is output, the drive circuit 13 generates a head drive voltage waveform for driving the (n−1)th capacitive load and supplies it to the ink-jet print head 12.

In this manner, the nth, (n−1)th, (n−2)th, . . . , 3rd, 2nd, and 1st capacitive loads are sequentially driven in the order named. That is, only one capacitive load is driven at a time. Since the value of the third counter 184 is "n−1" while the data for driving the first capacitive load is shifted, the third comparator 188 detects a coincidence. When the data transfer is complete in this state, and the second comparator 187 detects a coincidence, the AND gate 194 is enabled, and the third counter 184 is cleared.

After the first capacitive load is driven in this manner, the initial state is restored. If, therefore, the operation of this control circuit 18 is continued, the respective capacitive loads of the ink-jet print head 12 are repeatedly driven in the order of the nth, (n−1)th, (n−2)th, . . . , 3rd, 2nd, 1st, nth, (n−1)th, (n−2)th, . . . .

The capacitive loads of the ink-jet print head 12 can therefore be sequentially driven for an inspection by setting the coupler section 15 in an open state and driving the control circuit 18. When the oscilloscope 21 is operated in response to the enable signal output from the control circuit 18 and serving as a trigger, and the waveforms of a current flowing in the power line Vcc are detected and observed with the current probe 211 during such an inspection, the waveforms like the ones shown in FIGS. 6A to 6D are obtained.

Figure 6A:
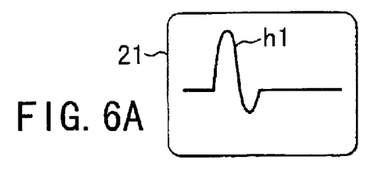
FIGS. 6A to 6D are views showing examples of current waveforms displayed on the display screen of the oscilloscope shown in FIG. 1.

Assume that all the capacitive loads are normal and have the same capacitance and equivalent series resistance, the ink-jet print head 12 is normally connected to the drive circuit 13, and the drive circuit 13 is normal. In this case, the driving waveforms detected from the 1st to nth capacitive loads are superimposed and displayed as one waveform h1 on the screen of the oscilloscope 21. That is, a waveform like the one shown in FIG. 6A is displayed. This waveform is the waveform of a charge current to each capacitive load. This waveform has a bound, which is produced owing to resonance between the inductance component of each wiring line and the capacitance of each capacitive load.

Figure 6B:
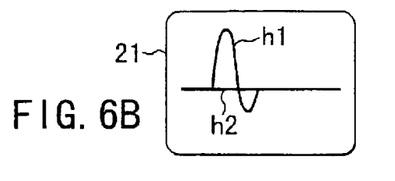

If, however, there is a disconnected one of the 1st to nth capacitive loads, disconnected wiring electrode for the capacitive load, or part of the drive circuit 13 that is not operable with respect to the related capacitive load, an observation waveform like the one shown in FIG. 6B is displayed on the screen of the oscilloscope 21. More specifically, if there is a portion such as a disconnected one of the 1st to nth capacitive loads, disconnected wiring electrode for the capacitive load, or part of the drive circuit 13 that is not operable with respect to the related capacitive load, a line spectrum on the oscilloscope 21 which corresponds to the above portion becomes a ground line h2 and is displayed along with the normal waveform h1.

Figure 6C:
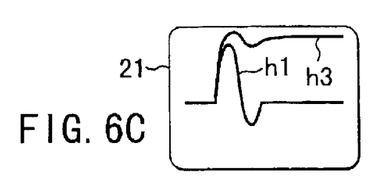
Figure 6D:
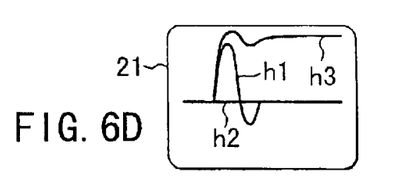

In contrast to this, if there is a short-circuited one of the 1st to nth capacitive loads, an observation waveform like the one shown in FIG. 6C is displayed on the screen of the oscilloscope 21. That is, a line spectrum on the oscilloscope 21 which corresponds to the short-circuited capacitive load changes to a stepped waveform h3. This waveform is displayed along with the normal waveform h1. If there are both a disconnected capacitive load and a short-circuited capacitive load, an observation waveform like the one shown in FIG. 6D is displayed.

Such observation waveforms can be easily discriminated on the oscilloscope 21. Note that observation waveforms can also be digitized to be automatically determined.

In the head unit 11 described above, the coupler section 15 is set in an open state at the defect inspection time, so that the waveform of a current flowing in the power line Vcc can be detected and observed with the oscilloscope 21 without being influenced by the capacitor 14. Accordingly, it is possible to accurately determine whether the head unit is nondefective or defective. After the inspection, the coupler section 15 is set in a closed state, so that the capacitor 14 can supply a current required by the drive circuit 13 for charging the capacitive loads. Thus, the head unit 11 can perform a reliable operation without difficulty.

Figure 7:
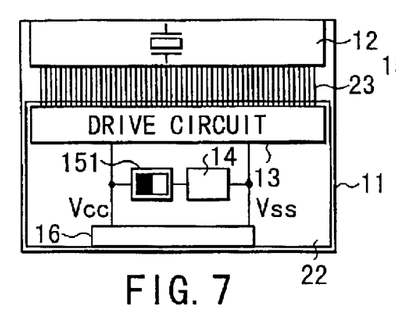
FIG. 7 is a view showing the detailed structure of the head unit shown in FIG. 1.

FIG. 7 shows the detailed arrangement of the head unit 11.

In the head unit 11, the connector 16 and the drive circuit 13 of an IC form are respectively mounted on one end and the other end of the surface of a printed board 22 and the output terminals of the drive circuit 13 are connected to lead or wiring electrodes of the print head 12 by wiring lines 23 such as TABs, bonding wires, or the like.

The printed board 22 has a pattern of power lines Vcc and Vss connected at one end to the connector 16 and at the other end to the input terminals of the drive circuit 13, and the capacitor 14 is connected in series with the coupler section 15 between the power lines Vcc and Vss on the printed board 22. The coupler section 15 is formed of a wiring pattern connected between the capacitor 14 and the power lines Vcc and Vss, and a slide switch 151 inserted in the wiring pattern.

The printed board 22 further has a pattern of signal lines for the enable signal, latch signal, data signal, and shift clock signal and a pattern of the 5-V power lines Vdd and Vss. These lines are connected at one end to the connector 16 and at the other end to the input terminals of the drive circuit 13.

By using the slide switch 151 in the coupler section 15, an operation of switching between connection and disconnection of the capacitor 14 is facilitated.

Figure 8:
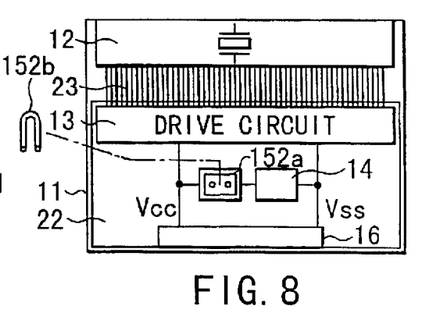
FIGS. 8 to 11 are views showing modifications of the head unit shown in FIG. 7.

FIG. 8 shows a first modification of the head unit 11 shown in FIG. 7. In this modification, the coupler section 15 is formed of a wiring pattern connected between the capacitor 14 and the power lines Vcc and Vss, and a connector 152a inserted in the wiring pattern and having a pair of open terminals to be short-circuited by a short-circuit plug 152b. The arrangement in FIG. 8 is the same as that shown in FIG. 7 except for this.

In this case, the short-circuit plug 152b is removed in an inspection, and is set to be in contact with the open terminals of the connector 152a to connect the capacitor 14 after the inspection.

With this arrangement, the cost of the coupler section 15 can be further reduced. In addition, whether an inspection is complete can be easily determined by checking the presence and absence of the short-circuit plug 152b.

Figures 9, 10:
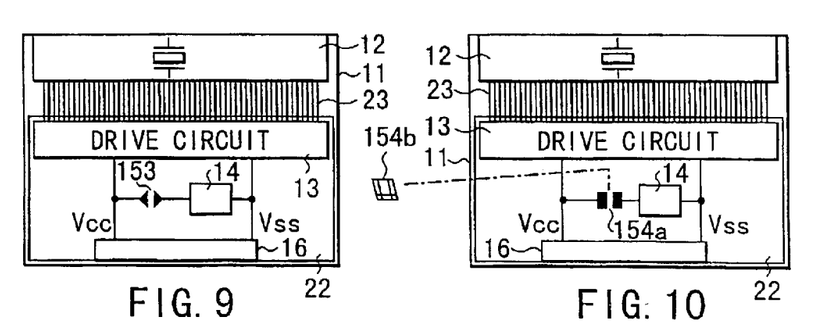

FIG. 9 shows a second modification of the head unit 11 shown in FIG. 7. In this modification, the coupler section 15 is formed of a wiring pattern which is connected between the capacitor 14 and the power lines Vcc and Vss and has a pair of open terminals 153 to be short-circuited by solder. The arrangement shown in FIG. 9 is the same as that shown in FIG. 7 except for this.

In this case, an inspection is performed by using the head unit 11 without any change. After the inspection, the open terminals 153 are short-circuited by solder applied in a bridge connection form.

With this arrangement, the cost of the coupler section 15 can be further reduced, and the area occupied by the section 15 can be reduced.

FIG. 10 shows a third modification of the head unit 11 shown in FIG. 7. In this modification, the coupler section 15 is formed of a wiring pattern which is connected between the capacitor 14 and the power lines Vcc and Vss and has a pair of open terminals 154a to be short-circuited by a chip jumper element 154b having a resistance of 0 Ω. The arrangement shown in FIG. 10 is the same as that shown in FIG. 7 except for this.

In this case, the chip jumper element 154b is removed in an inspection. After the inspection, the chip jumper element 154b is mounted on the open terminals 154a by soldering to short-circuit the open terminals 154a, thereby connecting the capacitor 14.

In this arrangement, when the process yield improves so that no inspection is required, the chip jumper element 154b can be automatically mounted, together with other circuit components in the assembling step. In addition, when the yield decreases for some reason, the chip jumper element 154b may not be mounted in the assembling step and may be mounted after the inspection. As described above, this arrangement exhibits flexibility in execution and non-execution of an inspection.

Figure 11:
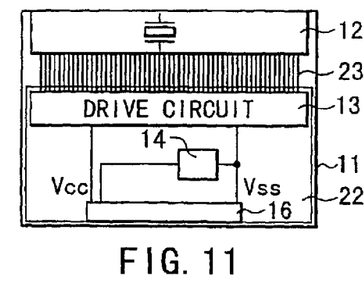

FIG. 11 shows a fourth modification of the head unit 11 shown in FIG. 7. In this modification, the coupler section 15 is formed of a wiring pattern which is connected between one end of capacitor 14 and a predetermined connection terminal of the connector 16, for example, next to a connection terminal connected to the power line Vcc and located on the left end of the connector 16 and between the other end of the capacitor 14 and the power line Vss. In an inspection, the connector 16 of the head unit 11 is connected to a control circuit of the inspection apparatus by an inspection cable 31 shown in FIG. 12A or inspection cable 32 shown in FIG. 12B. After the inspection, the connector 16 of the head unit 11 is connected to a control circuit incorporated in a produced ink-jet printer by a product cable 33 shown in FIG. 12C.

Figure 12A:
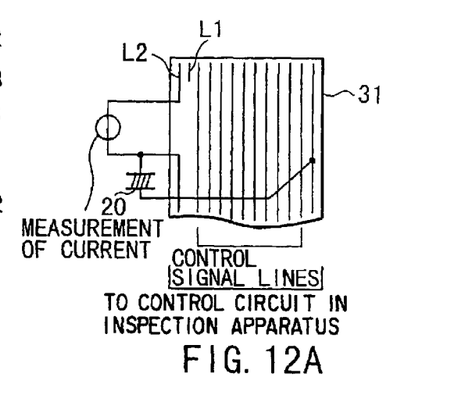
FIGS. 12A to 12C are views showing examples of cables which are connected to the head unit shown in FIG. 11 during and after a defect inspection.

The inspection cable 31 has a wiring line L2 connected to the connection terminal of the connector 16 for the power line Vcc, and a wiring line L1 connected to the connection terminal of the connector 16 which is located next to the connection terminal for the power line Vcc. Since the wiring line L1 is interrupted and spaced from the wiring line L2, the capacitor 14 is not electrically connected to the power line Vcc when the inspection cable 31 is used. In driving operation, a current flowing through the wiring line L2 can be measured to detect a waveform of the current without any influence of the capacitor 14.

Figure 12B:
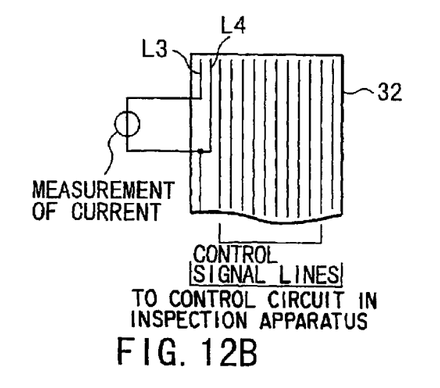

On the other hand, the inspection cable 32 also has a line L3 connected to the connection terminal on the left end of the connector 16 for the power line Vcc and a wiring line L4 connected to a connection terminal of the connector 16 which is next to the connection terminal for the power line Vcc. A current measuring point on the wiring line L3 is located closer to the connector 16 and more distant from the power source than a point where the wiring lines L4 is connected to the wiring line L3. Therefore, when the inspection cable 32 is used, the capacitor 14 is electrically connected to the power line Vcc. However, in driving operation, a current flowing through the wiring line L3 can be also measured to detect a waveform of the current without any influence of the capacitor 14.

Figure 12C:
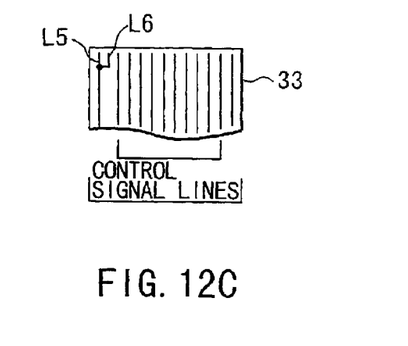

Moreover, the product cable 33 has also has a line L5 connected to the connection terminal on the left end of the connector 16 for the power line Vcc and a wiring line L6 connected to a connection terminal of the connector 16 which is next to the connection terminal for the power line Vcc. Further, the wiring lines L5 and L6 are connected to each other near the connector 16. When, therefore, the inspection is complete, and the product cable 33 is used to connect the control circuit to the connector 16 in the assembling step for obtaining a product, the capacitor 14 is electrically connected to the power line Vcc at a short wiring length. This allows the capacitor 14 to supply a current required for instantaneously charging the capacitive loads to the drive circuit 13 in driving operation.

By changing the types of cables, i.e., the inspection and product cables, to be connected to the connector 16 of the head unit 11 in this manner, the inactive and active states of the function of the capacitor 14 can be automatically switched.

Figure 13:
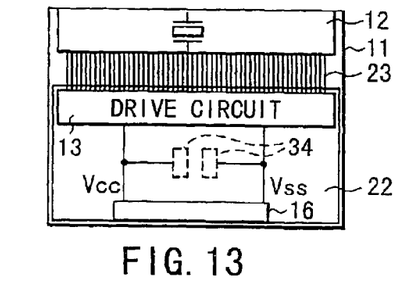
FIG. 13 is a view showing a modification of the head unit shown in FIG. 7.
Figure 14:
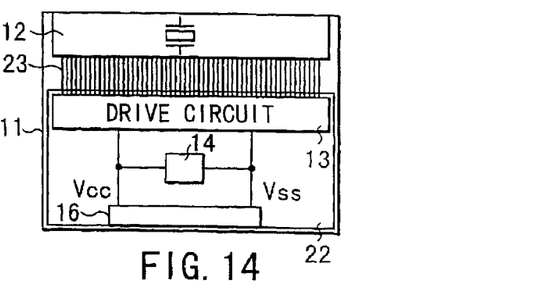
FIG. 14 is a view showing a state where a capacitor is mounted on the head unit shown in FIG. 13.

FIG. 13 shows a fifth modification of the head unit 11 shown in FIG. 7. FIG. 14 shows a state where a capacitor is mounted on the head unit shown in FIG. 13. As shown in FIG. 13, the head unit 11 has pads 34 for receiving the capacitor 14 to be mounted. A defect inspection is performed in the state shown in FIG. 13. After the inspection is complete, as shown in FIG. 14, the capacitor 14 is mounted on the pads 34 and connected to the power lines Vcc and Vss.

With this arrangement, since the capacitor 14 must be mounted after the inspection, the number of assembly steps increases. However, a current waveform can be easily detected without forming any special component. This arrangement is therefore effective when the quantity of products is small.

In addition, according to the inspection method of this embodiment, since a power source current supplied to the drive circuit is detected, the drive circuit ground need not be separated from the head ground. This method can therefore be applied to drive circuits for various types of ink-jet print heads.

Figure 15:
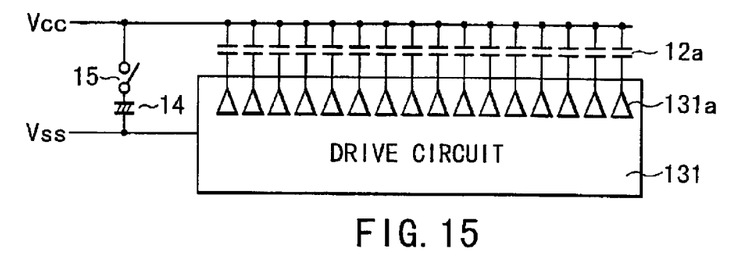
FIG. 15 is an equivalent circuit diagram of the ink-jet print head shown in FIG. 1.

FIG. 15 shows an equivalent circuit diagram of the ink-jet print head 12. In the print head 12, one ends of the capacitive loads 12a are connected commonly to the power line Vcc, and the other ends of the capacitive loads 12a are connected to output terminals 131a of a drive circuit 131.

Figure 16:
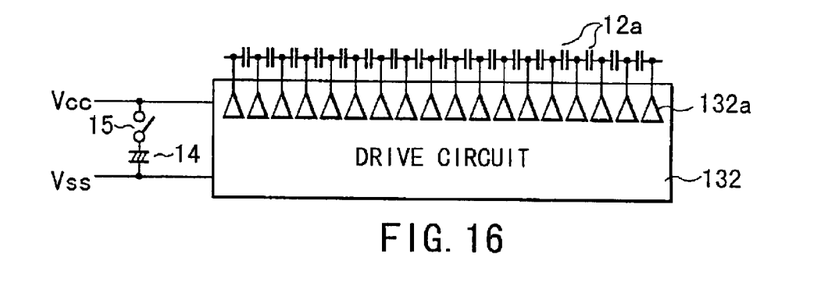
FIGS. 16 and 17 are equivalent circuit diagrams of modifications of the ink-jet print head shown in FIG. 1.

FIG. 16 shows an equivalent circuit diagram of the first modification of the ink-jet print head 12 shown in FIG. 1. In this modification, the capacitive loads 12a are connected in series and each of the capacitive loads 12a is connected between adjacent two of the output terminals 132a of a drive circuit 132.

Figure 17:
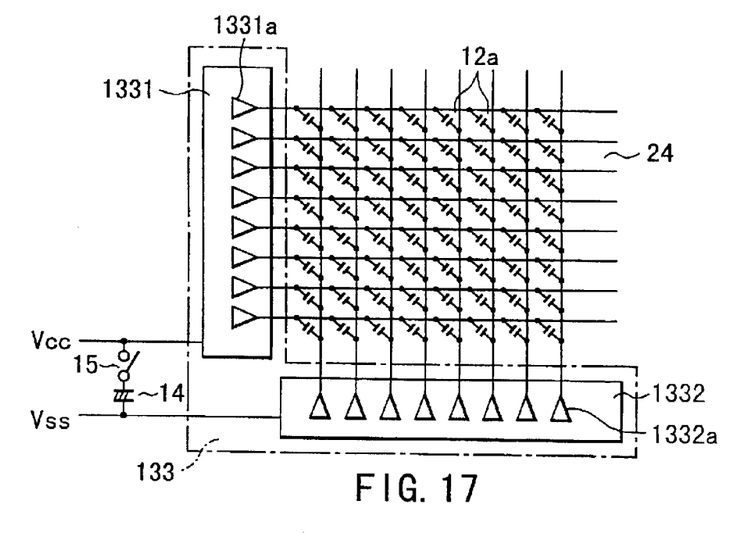

FIG. 17 shows an equivalent circuit diagram of the second modification of the ink-jet print head 12 shown in FIG. 1. In this modification, the capacitive loads 12a are arranged to form a matrix circuit 24. One ends of the capacitive loads 12a are connected to output terminals 1331a of an output port 1331 of a drive circuit 133, and the other ends of the capacitive loads 12a are connected to output terminals 1332a of an output port 1332 of the drive circuit 133.

The coupler section 15 is opened and the capacitor 14 is disconnected from each of the drive circuits 131, 132, and 133 for the respective types of ink-jet print heads shown in FIGS. 15, 16, and 17. The respective capacitive loads 12a are then sequentially driven, and the waveform of a current flowing through the power line Vcc is detected. By observing the current waveform with the oscilloscope 21, the user can determine whether the head unit is nondefective or defective.

In this embodiment, measurement is performed by detecting the waveform of a current flowing through the power line Vcc. However, the same result can be obtained when measurement is performed by detecting the waveform of a current flowing through the power line Vss.

Figure 18:
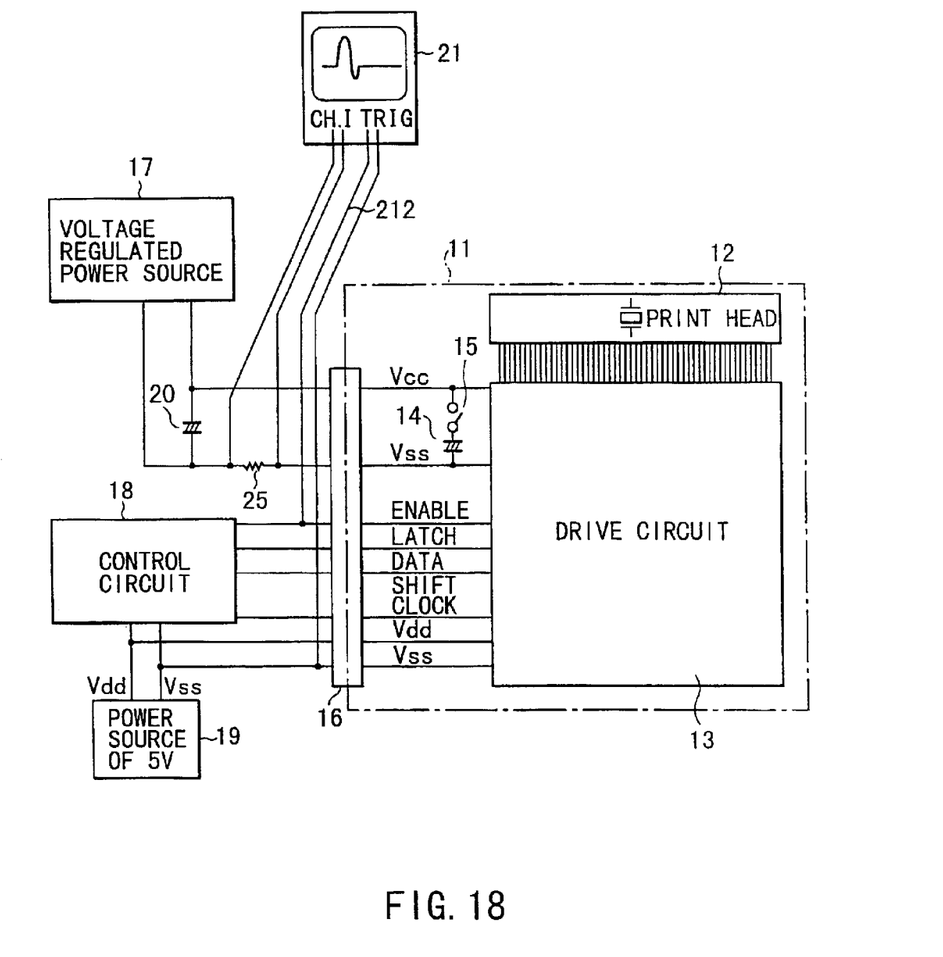
FIGS. 18 and 19 are block diagrams showing modifications of an inspection apparatus shown in FIG. 1.

In addition, in this embodiment, the waveform of a current flowing through the power line Vcc is detected with the current probe 211. However, the present invention is not limited to this. FIG. 18 shows a first modification of the inspection apparatus shown in FIG. 1. As shown in FIG. 18, when a resistor 25 having a resistance low enough to exert no influence on the operation is inserted in series in the power line Vss, and a voltage drop across the resistor 25 is measured, the same result can be obtained because a current waveform can be indirectly detected.

Figure 19:
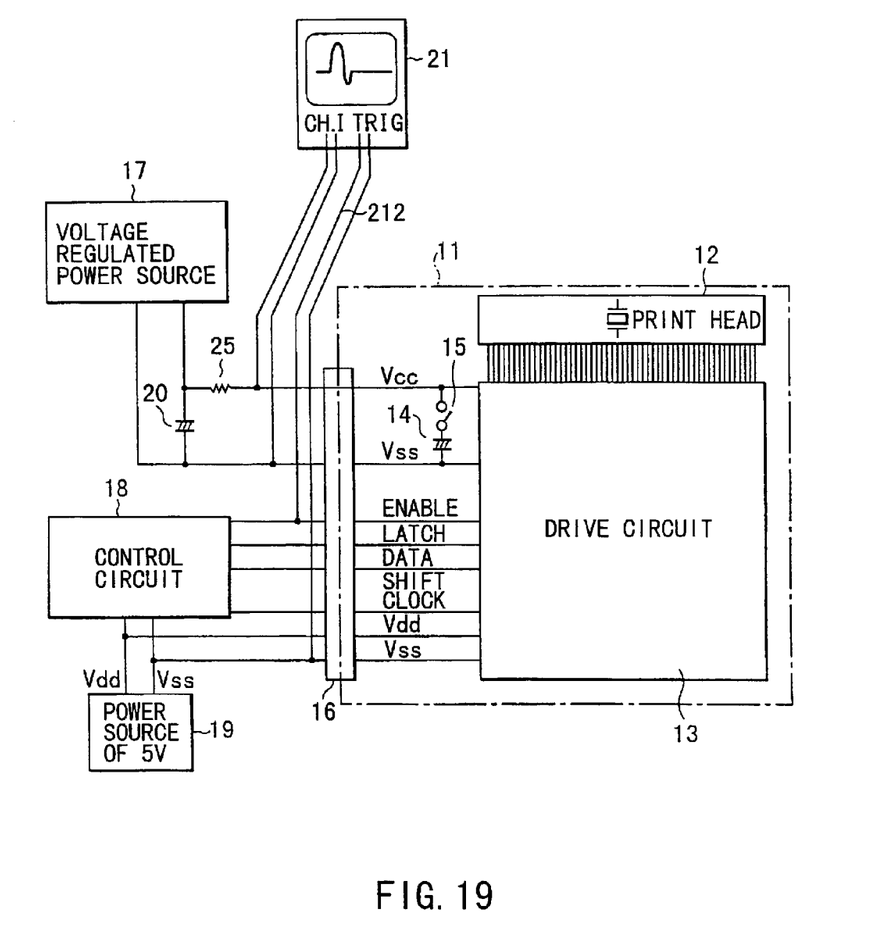

In this embodiment, an inspection is performed by directly or indirectly detecting a current waveform. However, the present invention is not limited to this, and an inspection may be performed by directly detecting a voltage variation waveform. FIG. 19 shows a second modification of the inspection apparatus shown in FIG. 1. If, for example, the output voltage form the voltage regulated power source 17 is stable, a power source voltage between the power lines Vcc and Vss may be directly detected to measure a power source voltage variation waveform. In this case, the resistor 25 is connected in series in the power line Vcc. That is, the inspection is not limited to detecting a current waveform as a waveform to be detected as long as nondefective and defective products can be discriminated. In addition, an inductor, semiconductor element, or the like, or an arbitrary impedance circuit formed by using a combination thereof may be used in place of the resistor 25 to improve the detection sensitivity or change a detection waveform into a waveform that can be easily discriminated.

In this embodiment, the capacitive loads 12a of the print head 12 are sequentially driven, from the nth load to the 1st load. When all the capacitive loads are driven, this operation is repeated. With this control, as the oscilloscope 21, an analog non-storage oscilloscope can be used. Since the repetition display cycle of the analog oscilloscope is shorter than that of the digital oscilloscope, the speed of clocks from a clock generator 181 can be increased. This can shorten the time required for an inspection.

In inspecting the head unit 11, only a small number of capacitive loads are detected as defective elements when they are driven. When, therefore, current waveforms are observed with an analog oscilloscope, normal waveforms are repeatedly displayed in most cases, whereas the number of times abnormal waveforms are displayed is very small. For this reason, the luminance of displayed normal waveforms is high, but the luminance of displayed abnormal waveforms is very low. Under the circumstances, the observer of the oscilloscope may miss an abnormal waveform. To solve this problem, an analog oscilloscope of an after-image type may be used.

As the oscilloscope 21, a digital storage oscilloscope can also be used. In general, the digital storage oscilloscope displays waveforms with a constant luminance regardless of the frequencies of occurrence. Therefore, the luminance of an abnormal waveform with a low frequency occurrence does not decrease. This allows reliable observation of abnormal waveforms. In the use of the digital storage oscilloscope, each of n capacitive loads may be driven once.

To execute this operation, the control circuit 18 in FIG. 3 may be changed such that when each of the n capacitive loads is completely driven once, and an AND gate 194 is enabled, the operation of the circuit is stopped instead of being repeated. When the control circuit 18 completely drives each of the n capacitive loads once and stops operating, a display means such as an LED may be used to notify the operator of the end of the operation. With this operation, the operator can easily know the end of the inspection.

Since the waveform repetition display cycle of the digital storage oscilloscope is long, the time intervals at which the respective capacitive loads are sequentially driven must be set to be long in accordance with this cycle. In addition, since the digital storage oscilloscope can digitally process received current waveforms, whether a received current waveform falls within a normal waveform range can be automatically determined by digital processing instead of being determined by the operator upon observation of the displayed contents. In this case, since current waveforms need not be displayed on the screen, the oscilloscope need not be used as a current waveform recording means, and a digital memory having the function of recording current waveforms may be used.

In this embodiment, the waveforms observed when the respective capacitive loads are driven are superimposed and displayed on the screen of the oscilloscope 21, and the operator checks the waveform deviation between a normal waveform and abnormal waveform to determine whether the head unit is nondefective or defective. However, the present invention is not limited to this. A normal waveform range may be marked on the screen of the oscilloscope 21 in advance, and whether a head unit is nondefective or defect may be determined by checking whether each waveform falls within the marked range. Marking may be performed by using the cursor display function of the oscilloscope. A simpler way is to directly mark a range on the screen with a marker pen or the like.

Figure 20A:
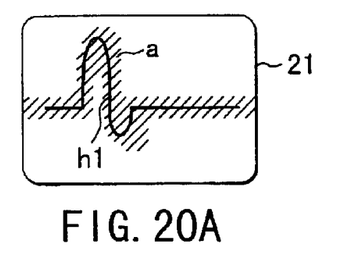
FIGS. 20A to 20G are views showing the relationship between the current waveforms displayed on the oscilloscope and a predetermined allowable range.

A case wherein a normal waveform range is marked on the screen of the oscilloscope 21 will be described below. For example, this range is marked as indicated by oblique lines a in FIGS. 20A to 20G. With this marking, when all the capacitive loads are normal and have the same capacitance and equivalent series resistance, and the drive circuit 13 and the connection between the print head 12 and drive circuit 13 are normal, the waveforms detected when the 1st to nth capacitive loads are driven superimposed and displayed as one waveform h1 on the screen of the oscilloscope 21 within the marked range, as shown in FIG. 20A.

Figure 20B:
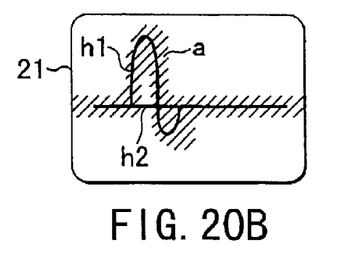

If, however, there is a disconnected one of the 1st to nth capacitive loads, disconnected wiring electrode for the capacitive load, or part of the drive circuit 13 that is not operable with respect to the related capacitive load, the emission lines of the normal driving waveform h1 and waveform h2 of a ground line are superimposed and displayed on the screen of the oscilloscope 21, as shown in FIG. 20B. The waveform h2 of the ground line falls outside the marked range at the position of a peak of the normal driving waveform h1.

Figure 20C:
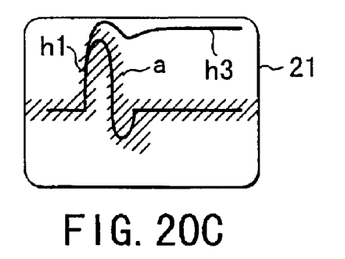

In contrast to this, if there is a short-circuited one of the 1st to nth capacitive loads, the emission lines of the normal driving waveform h1 and waveform h3 that rises in a stepped form are superimposed and displayed on the screen of the oscilloscope 21, as shown in FIG. 20C. In this case, the waveform h3 falls outside the marked range.

Figure 20D:
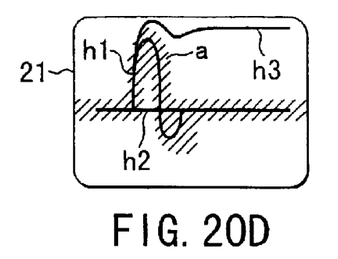

If there are a disconnected capacitive load and a short-circuited capacitive load among the 1st to nth capacitive loads, the emission lines of the normal driving waveform h1, waveform h2 of the ground line, and waveform h3 that rises in a stepped form are superimposed and displayed on the screen of the oscilloscope 21, as shown in FIG. 20D. In this case, both the waveforms h2 and h3 fall outside the marked range.

Figure 20E:
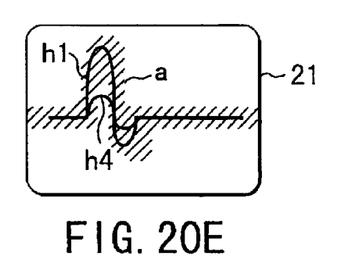

If there is a capacitive load having an excessively small capacitance among the 1st to nth capacitive loads, or a connection electrode or drive circuit for a capacitive load which has an excessively large circuit resistance, the normal driving waveform h1 and an abnormal waveform h4 with a small current are superimposed and displayed on the screen of the oscilloscope 21, as shown in FIG. 20E. In this case, the abnormal waveform h4 falls outside the marked range.

Figure 20F:
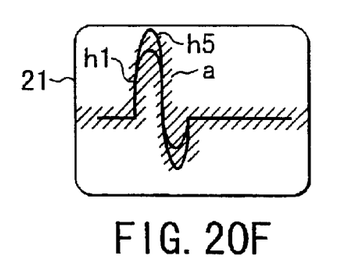

If there is a capacitive load having an excessively large capacitance among the 1st to nth capacitive loads, the normal driving waveform h1 and an abnormal waveform h5 with a large current are superimposed and displayed on the screen of the oscilloscope 21, as shown in FIG. 20F. In this case, the abnormal waveform h5 falls outside the marked range.

Figure 20G:
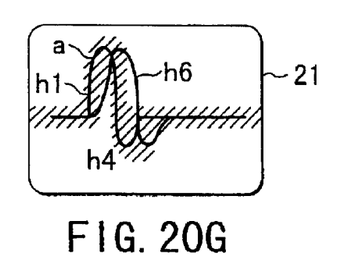

If there is a drive circuit having an excessively large delay, the normal driving waveform h1 and an abnormal waveform h6 with a delay are superimposed and displayed on the screen of the oscilloscope 21, as shown in FIG. 20G. In this case, the abnormal waveform h6 falls outside the marked range.

As described above, nondefective and defective determination on each head unit can be accurately performed by using the markings on the screen of the oscilloscope 21.

In addition, if the waveforms detected when the respective capacitive loads are driven are superimposed and displayed on the screen of the oscilloscope 21 with the normal range being marked on the screen of the oscilloscope 21, the operator can easily find an abnormal driving waveform. This allows the operator to more accurately determine whether a head unit is nondefective or defective. Note that when the waveforms detected when the respective capacitive loads are driven are superimposed and displayed on the screen of the oscilloscope 21, a dynamic characteristic defect including information about a change over time, like the one shown in FIG. 20G, can be accurately detected.

In the control circuit 18 in FIG. 3, a preset register may be used instead of clearing the third counter 184. A value "n−m" is preset in the third counter 184 by using this present register. In this case, when the comparison input terminals of the third comparator 188 which are connected to the register 185 are connected to another register, and a value "n−k" is set in the register in advance, only kth to mth (n≧m≧k≧1) capacitive loads can be sequentially driven. With this control, if a defective capacitive load is detected in the first inspection, an analysis can be made to specify the position of the defective capacitive load.

The above embodiment has exemplified the case wherein the ink-jet print head using electrostrictive members as capacitive loads is driven. However, the present invention is not limited to this and can be applied to a case wherein an apparatus using liquid crystal elements, which are capacitive loads like electrostrictive members, EL print head, and the like are driven as capacitive loads.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inspection method for a capacitive load driving unit which comprises a plurality of capacitive loads, a drive circuit for charging and discharging said capacitive loads, a pair of power lines for supplying a drive voltage from an external power source to said drive circuit, and a current reserve circuit for reserving a current required by said drive circuit for charging said capacitive loads, wherein said current reserve circuit includes a capacitor that is charged by the drive voltage from said power lines, and a coupler section that selectively couples the capacitor between the power lines and decouples the capacitor from the power lines, such that the cower lines keen supplying the drive voltage from the external power source to the drive circuit even while the capacitor remains decoupled from the power lines, said method comprising:
   controlling said drive circuit to sequentially drive said plurality of capacitive loads in a state in which said capacitor is disconnected from said power lines; and
   detecting an electric change that occurs on said power line upon driving each of said capacitive loads to determine whether a defect is present.

2. An inspection method for a capacitive load driving unit which comprises a plurality of capacitive loads, a drive circuit for charging and discharging said capacitive loads, and a pair of power lines for supplying a drive voltage from an external power source to said drive circuit, said method comprising:
   controlling said drive circuit to sequentially drive said plurality of capacitive loads; and
   detecting an electric change that occurs on said power line upon driving each of said capacitive loads to determine whether not a defect is present;
   wherein said detecting includes superimposing and recording waveforms of the electric change in synchronism with a driving timing of each of said capacitive loads to recognize, as an indication of the presence of a defect, a state in which the recorded waveform falls outside a predetermined allowable range.

3. An inspection method according to claim 2, wherein said waveforms are superimposed and recorded as displayed after-images on an oscilloscope.

4. An inspection apparatus for a capacitive load driving unit which comprises a plurality of capacitive loads, a drive circuit for charging and discharging said capacitive loads, a pair of power lines for supplying a drive voltage from an external power source to said drive circuit, and a current reserve circuit for reserving a current required by said drive circuit for charging said capacitive loads, wherein said current reserve circuit includes a capacitor that is charged by the drive voltage from said power lines, and a coupler section that selectively couples the capacitor between the power lines and decouples the capacitor from the power lines, such that the power lines keen supplying the drive voltage from the external power source to the drive circuit even while the capacitor remains decoupled from the power lines, said apparatus comprising:
   a control circuit for controlling said drive circuit to sequentially drive said plurality of capacitive loads in a state in which said capacitor is disconnected from said power lines; and
   a detecting circuit for detecting an electric change that occurs on said power line upon driving each of said capacitive loads to determine whether a defect is present.

5. An inspection apparatus according to claim 4, wherein said oscilloscope is a digital storage oscilloscope, and said control circuit includes notifying means for notifying an end of defect inspection after the trigger signals have been generated for all of the capacitive loads.

6. An inspection apparatus for a capacitive load driving unit which comprises a plurality of capacitive loads, a drive circuit for charging and discharging said capacitive loads, and a pair of power lines for supplying a drive voltage from an external power source to said drive circuit, said apparatus comprising:
   a control circuit for controlling said drive circuit to sequentially drive said plurality of capacitive loads; and
   a detecting circuit for detecting an electric change that occurs on said power line upon driving each of said capacitive loads to determine whether a defect is present;
   wherein said detecting circuit includes a recording section for superimposing and recording waveforms of the electric change in synchronism with a driving timing of each of said capacitive loads to recognize, as an indication of the presence of a defect, a state in which the recorded waveform falls outside a predetermined allowable range.

7. An inspection apparatus according to claim 6, wherein said control circuit includes a signal generating section for sequentially generating trigger signals which respectively enable said capacitive loads to be driven, and said recording section includes an oscilloscope for superimposing and recording the waveforms of the electric change as displayed after-images in response to each of the trigger signals.

8. An inspection apparatus according to claim 7, wherein said oscilloscope is a digital storage oscilloscope, and said detecting circuit includes a determination circuit for identifying the state in which the waveform of the electric change falls outside the predetermined allowable range.

* * * * *